(12) United States Patent
Lee

(10) Patent No.: US 6,455,344 B1
(45) Date of Patent: Sep. 24, 2002

(54) METHOD OF FABRICATING A PLANAR POROUS SILICON METAL-SEMICODUCTOR-METAL PHOTODETECTOR

(75) Inventor: Ming-Kwei Lee, Kaohsiung (TW)

(73) Assignee: National Science Council, Taipei (TW)

( * ) Notice: Subject to any disclaimer, the term of this patent is extended or adjusted under 35 U.S.C. 154(b) by 0 days.

(21) Appl. No.: 09/302,120

(22) Filed: Apr. 29, 1999

(30) Foreign Application Priority Data

May 19, 1998 (TW) ............................................ 87107690

(51) Int. Cl.$^7$ ......................... H01L 21/00; H01L 27/15
(52) U.S. Cl. ............................ 438/57; 438/88; 438/92; 257/82
(58) Field of Search ............................. 438/57, 22, 92, 438/21, 23, 34, 88, 570; 257/82, 84, 103

(56) References Cited

U.S. PATENT DOCUMENTS

| | | | |
|---|---|---|---|
| 4,990,988 A | * 2/1991 | Lin ............................. | 257/215 |
| 5,427,977 A | * 6/1995 | Yamada et al. ............... | 438/22 |
| 5,478,757 A | * 12/1995 | Lee ............................ | 438/92 |
| 5,644,156 A | * 7/1997 | Suzuki et al. ............... | 257/485 |
| 5,726,464 A | * 3/1998 | Kumomi et al. ............. | 257/103 |
| 5,739,565 A | * 4/1998 | Nakamura et al. .......... | 257/301 |
| 5,834,378 A | * 11/1998 | Kurtz et al. ................ | 438/694 |
| 5,914,183 A | * 6/1999 | Canham .................. | 428/312.6 |
| 6,017,811 A | * 1/2000 | Winton et al. ............... | 438/597 |
| 6,103,546 A | * 8/2000 | Lee ........................... | 438/57 |
| 6,143,629 A | * 11/2000 | Sato ........................... | 438/455 |
| 6,171,512 B1 | * 1/2001 | Sakaguchi et al. ............ | 216/56 |
| 6,249,080 B1 | * 1/2001 | Komoda et al. ............ | 313/310 |

OTHER PUBLICATIONS

Canham, "Silicon quantum wire array fabrication by electrochemical and chemical dissolution in wafers," *Appl. Phys. Lett.*, Sep. 3, 1990, pp. 1046–1048, vol. 57, No. 10.

Petrova–Koch et al., "Rapid–thermal–oxidized porous Si—The superior photoluminescent Si," *Appl. Phys. Lett.*, Aug. 24, 1992, pp. 943–945, vol. 61, No. 8.

Yan et al., "Study of thermal oxidation and nitrogen annealing of luminescent porous silicon," *Appl. Phys. Lett.*, Mar. 14, 1994, pp. 1374–1376, vol. 64, No. 11.

Shih et al., "Photoinduced luminescence enhancement from anodically oxidized porous Si," *Appl. Phys. Lett.*, Dec. 13, 1993, pp. 3306–3308, vol. 63, No. 24.

L. T. Canham, "Silicon quantum wire array fabrication by electrochemical and chemical dissolution of wafers", Appl. Phys. Lett., vol. 57, No. 10, Sep. 3, 1990.

V. Petrova–Koch, T. Muschik, A. Kux, B. K. Meyer, F. Koch and V. Lehmann; "Rapid–thermal–oxidized porous Si—The superior photoluminescent Si"; Appl. Phys. Lett., vol. 61, No. 8, Aug. 24, 1992.

J. Yan, S. Shih, K. H. Jung, D. L. Kwong, M. Kovar, J. M. White, B. E. Gnade and L. Magel; "Study of thermal oxidation and nitrogen annealing of liminescent porous silicon"; Appl. Phys. Lett., vol. 64, No. 11, Mar. 14, 1994.

* cited by examiner

*Primary Examiner*—Trung Dang
*Assistant Examiner*—Brook Kebede
(74) *Attorney, Agent, or Firm*—Birch, Stewart, Kolasch & Birch, LLP

(57) ABSTRACT

A high gain and low leakage current porous silicon metal-semiconductor-metal planar photodetector was fabricated through rapid thermal oxidation (RTO) and rapid thermal annealing (RTA). A high responsivity of 2.15 A/W can be obtained under a 0.85 mW 675 nm laser diode illumination. The gain is 400%. It shows high potential as a device applied in optoelectronics and optoelectronic integrated circuits.

4 Claims, 9 Drawing Sheets

Figure 1:
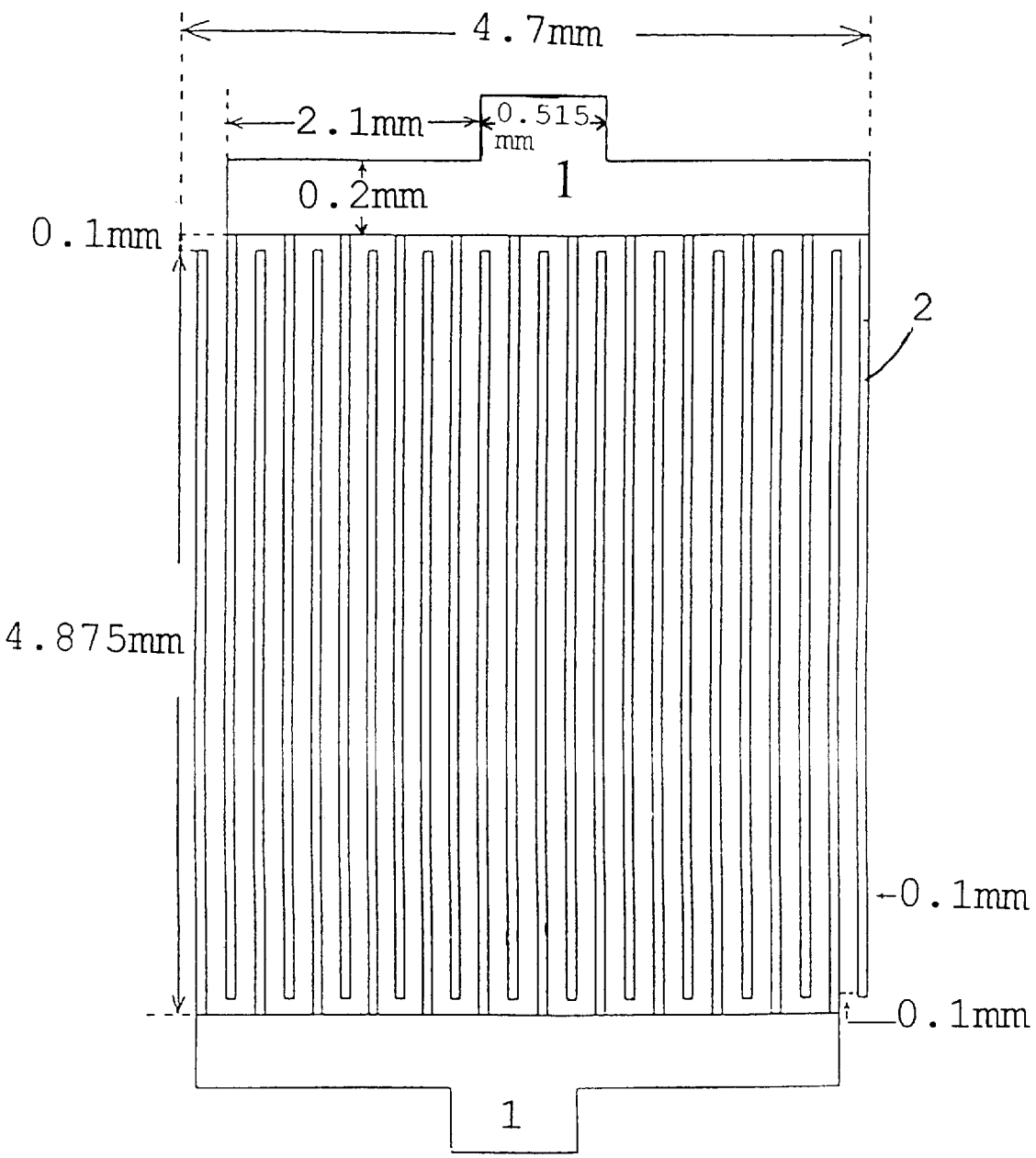

METHOD OF FABRICATING A PLANAR POROUS SILICON METAL-SEMICODUCTOR-METAL PHOTODETECTOR

BACKGROUND OF THE INVENTION

1. Field of the Invention

The present invention demonstrates the method of fabricating porous silicon metal-semiconductor-metal planar photodetector.

2. Description of the Prior Art

Photodetector is a device that can convert light signal into electrical signal. It is widely used in various areas like communication, computer, control, and medical applications. Since silicon cannot emit light efficiently, optoelectronics is developed in the area of compound semiconductor. So far high illumination light emitting diode has been developed from porous silicon, therefore if there is a corresponding planar photodetector, then silicon integrated optoelectronic circuit can be developed. Metal-semiconductor-metal planar photodetector (M-S-M) is of great potential to be applied in optoelectronics integrated circuit since (1) it's structure is planar, (2) no minority carrier storage and the distance between electrodes is short so that the response is fast, (3) simple to fabricate, low cost, (4) high electro-optics conversion efficiency, and also high stability photodetector is demanded by the market widely.

There are four advantages to apply porous silicon in photodetector: (1) since it is direct bandgap, so the elector-optics conversion efficiency is high, (2) porous surface can increase the absorption rate of light (3) it has high gain due to avalanche effect, (4) simple to fabricate, low cost, so porous silicon is a good photodetecting material. The present invention fabricates a high gain and low leakage current porous silicon metal-semiconductor-metal planar photodetector.

Silicon is the most matured semiconductor material developed so far. well The integrated circuit technology of silicon is well developed. Optoelectronic integrated circuit is the future integrated circuit which has faster speed, since it transmits signal with the speed of light. Photodetector is the necessary device of optoelectronic integrated circuit in the respect of function and structure. Metal-semiconductor-metal photodetector is planar photodetector, specially suitable to be used in optoelectronic integrated circuit. Furthermore, since it has no minority carrier storage and the distance between electrodes is short so the response is fast.

Porous silicon differs from bulk silicon, according to the report of L. T. Canham in *Appl. Phys. Lett.*, Vol. 57, pp.1046 (1990), after the silicon surface is etched by the current in electrolytic solution and becomes porous, the energy band is folded and its indirect energy gap becomes direct bandgap, so that the electro-optics conversion efficiency is increased, therefore the quantum coefficient of photon is increased. At the same time since the surface of porous silicon is porous which can eliminate the secondary reflection of light, so the absorption rate of light is increased, we can obtain better photocurrent and photosensitivity without antireflection coating.

Additionally, the wire size of the porous silicon is very narrow, and it is in complete depletion, so the avalanche effect in the local region will occur due to bias and amplify the optical signal, and thereby the photodetector will have high gain.

From the above, there are five advantages to apply porous silicon in photodetector: (1) since it is direct bandgap, so the electro-optics conversion efficiency is high, (2) porous surface can increase the absorption rate of light (3) it has high gain due to avalanche effect, (4) directly formed on silicon wafer so that it is totally matched with silicon integrated circuit. (5) its fabrication process and structure are simple and the cost is low, so porous silicon is a good photodetector material.

But as-grown porous silicon photodetector has several disadvantages: (1) optical and electrical characteristics are not stable, (2) photocurrent and photosensitivity is not high enough, (3) dark current is not low enough, which limits the application of photodetector.

The following depicts the problems hereby resolved by the present invention.

So far the development of metal-semiconductor-metal porous silicon photodetector still has the following problems: (1) photocurrent and photosensitivity is not high enough, (2) dark current is not low enough, which limits the application of planar metal-semiconductor-metal photodetector in optoelectronic integrated circuit.

SUMMARY OF THE INVENTION

The present invention applies the method of rapid thermal oxidation (RTO) and rapid thermal annealing (RTA) to fabricate high gain and low leakage current porous silicon metal-semiconductor-metal planar photodetector. The photocurrent and photosensitivity of the present invention is raised high, and the dark current of the present invention is reduced, which makes the application of planar metal-semiconductor-metal photodetector in optoelectronic integrated circuit to be more widespread.

BRIEF DESCRIPTION OF THE INVENTION

Figure 2A:
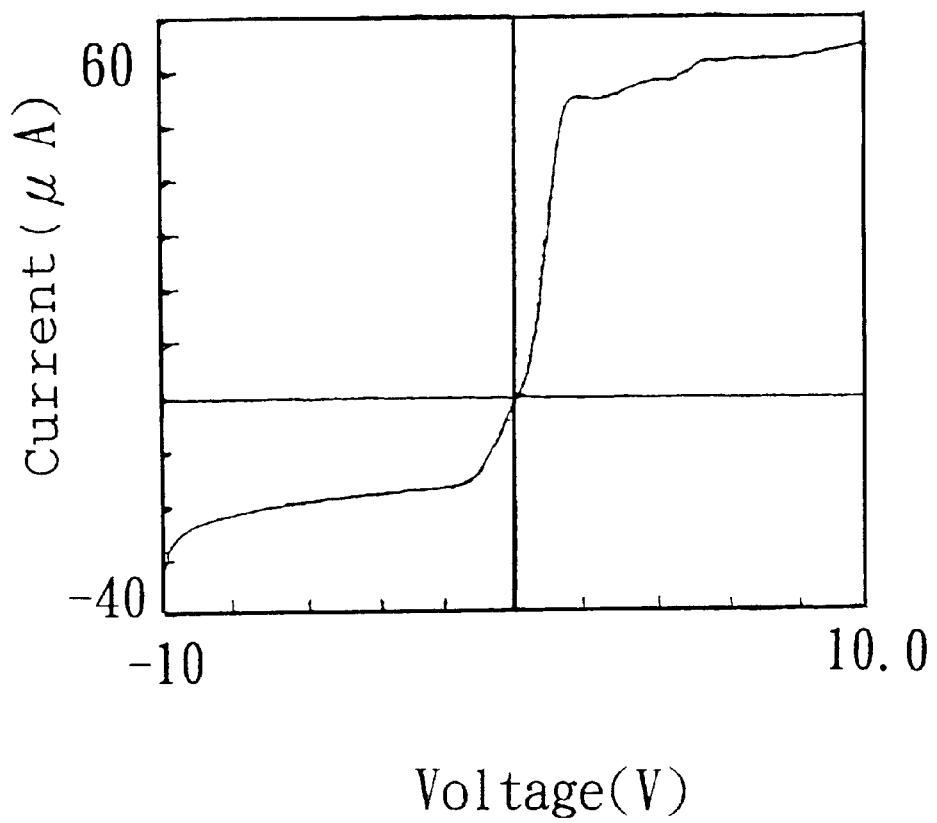

FIG. 1 shown the structure of the aluminum electrode of planar metal-semiconductor-metal photodetector on the front side.
1. Bonding pad
2. Finger type light absorption area FIG. 2 shown the photocurrent response and the I-V characteristics of dark current after the processing of rapid thermal oxidation (RTO) for 60 sec at 850° C. of porous silicon metal-semiconductor-metal planar photodetector FIG. 2(a) shown the I-V characteristics of dark current.

Figure 2B:
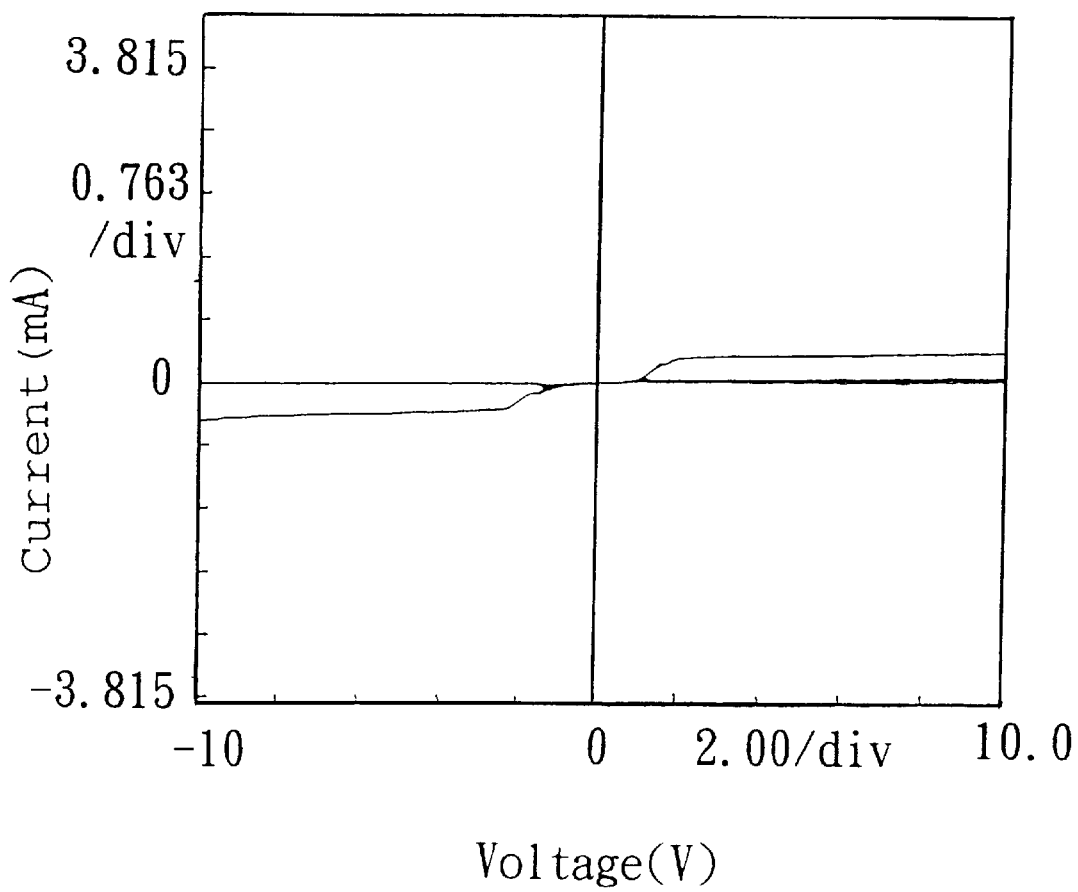

FIG. 2(b) shown the I-V characteristics of photocurrent under the illumination of 0.85 mW 675 nm laser diode.

Figure 2C:
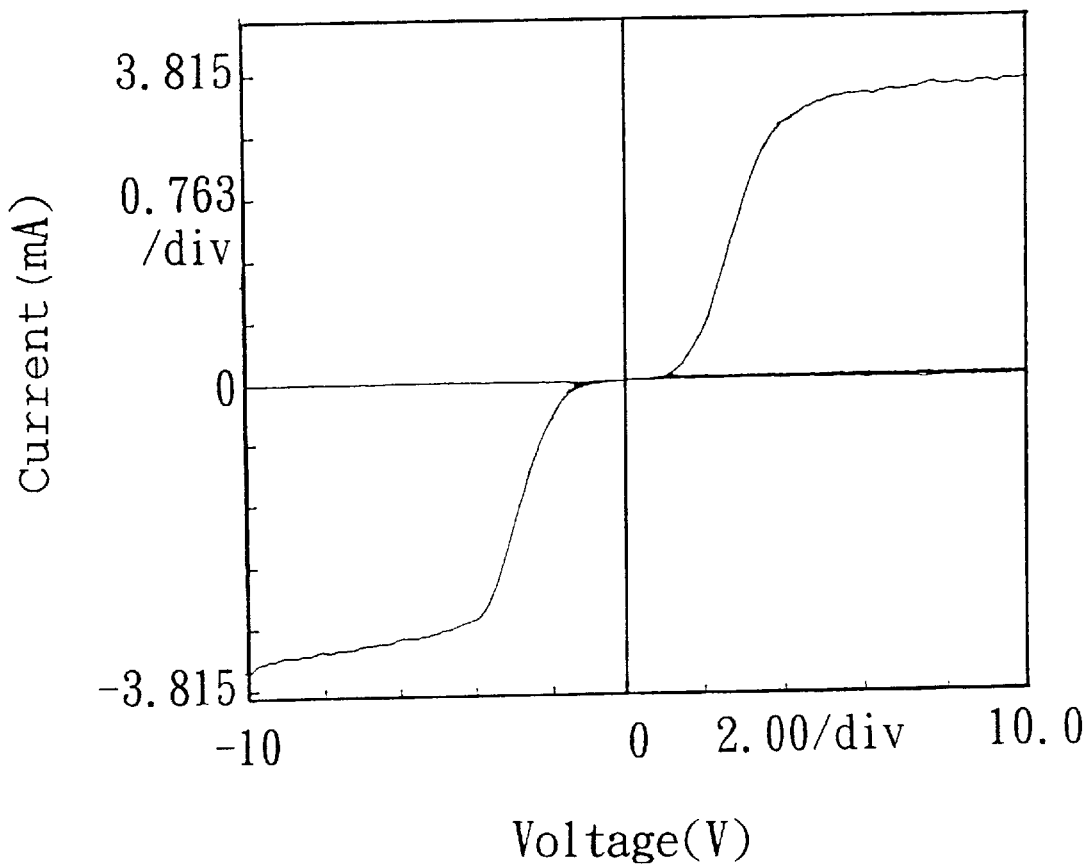

FIG. 2(c) shown the I-V characteristics of photocurrent under the illumination of 24 mW/cm$^2$ tungsten lamp.

Figure 3:
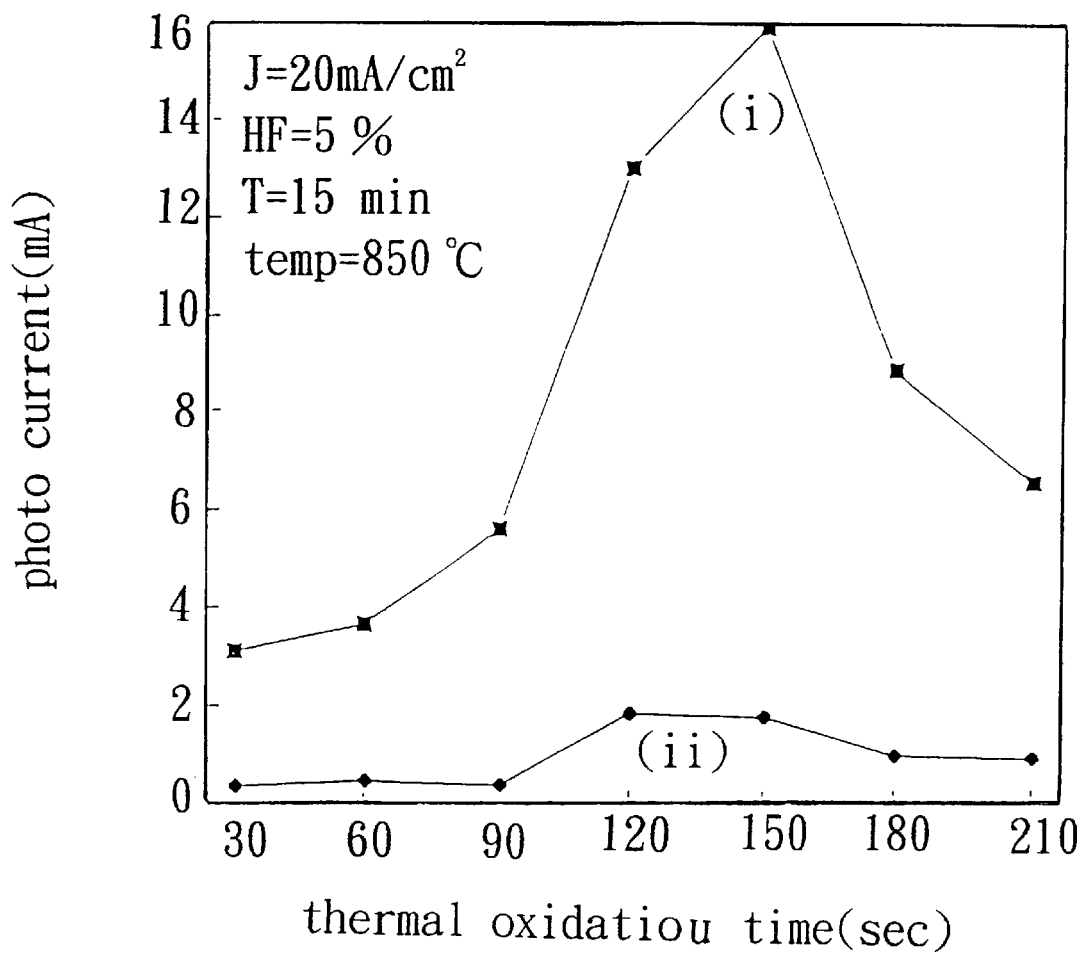

FIG. 3 shown the photocurrent as a function of the oxidation time of rapid thermal oxidation (RTO) of porous silicon metal-semiconductor-metal planar photodetector (i) The variation of photocurrent with respect to the oxidation time of rapid thermal oxidation (RTO) under the illumination of 24 mW/cm$^2$ tungsten lamp at −10V (ii) The variation of photocurrent with respect to the oxidation time of rapid thermal oxidation (RTO) under the illumination of 0.85 mW 675 nm laser diode at −10V.

Figure 4:
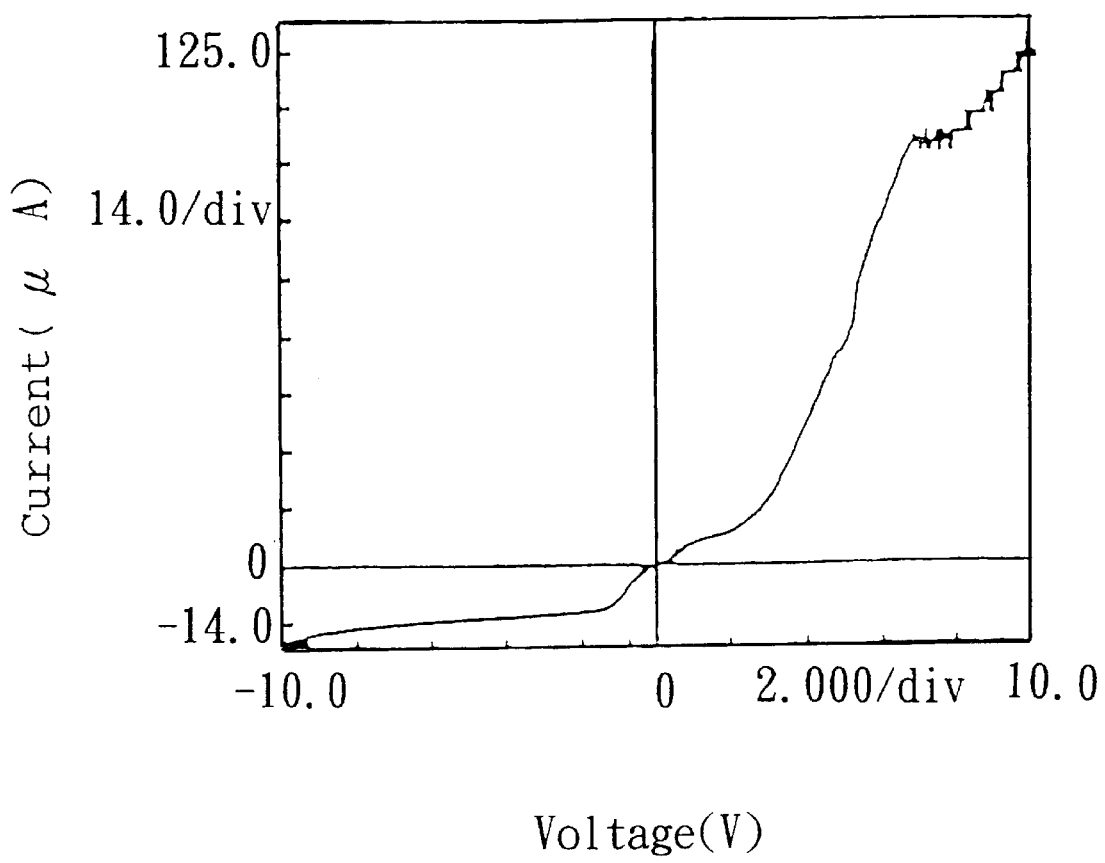

FIG. 4 shown the I-V characteristics of dark current after being processed by rapid thermal oxidation (RTO) for 90 sec at 850° C. (without being processed by rapid thermal annealing).

Figure 5:
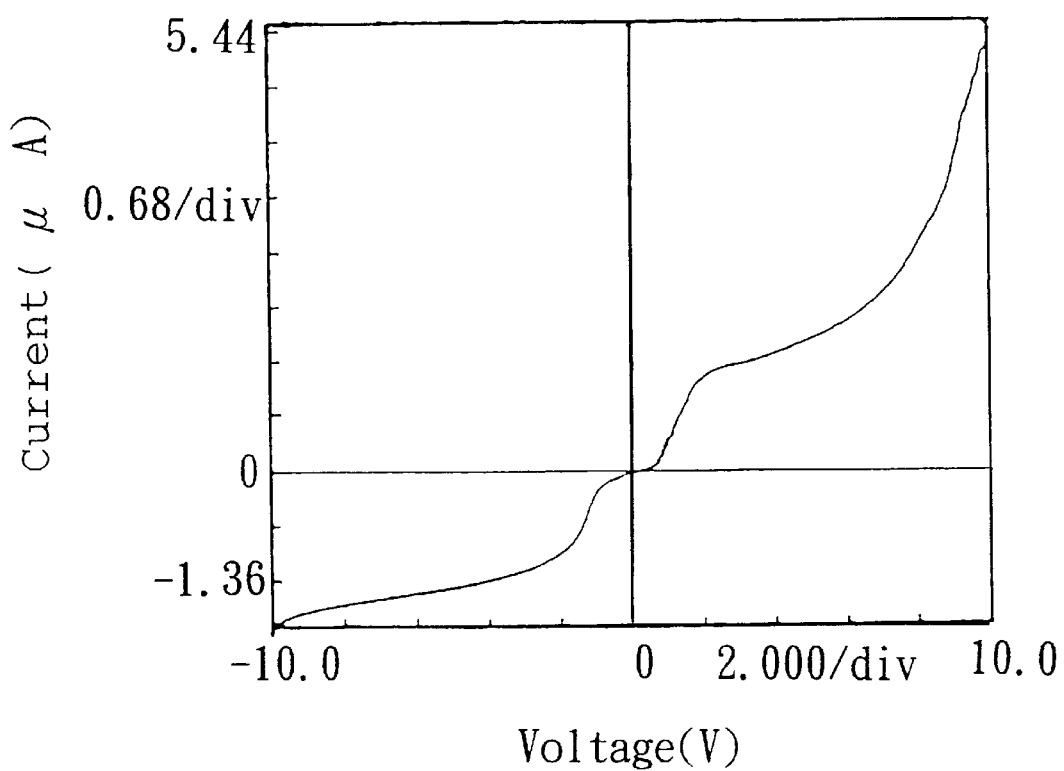

FIG. 5 shown the I-V characteristics of dark current of the porous silicon metal-semiconductor-metal planar photodetector after being processed by rapid thermal oxidation (RTO) at 850° C. for 90 sec, and then processed by rapid thermal annealing (RTA) at 850° C. for 60 sec.

Figure 6:
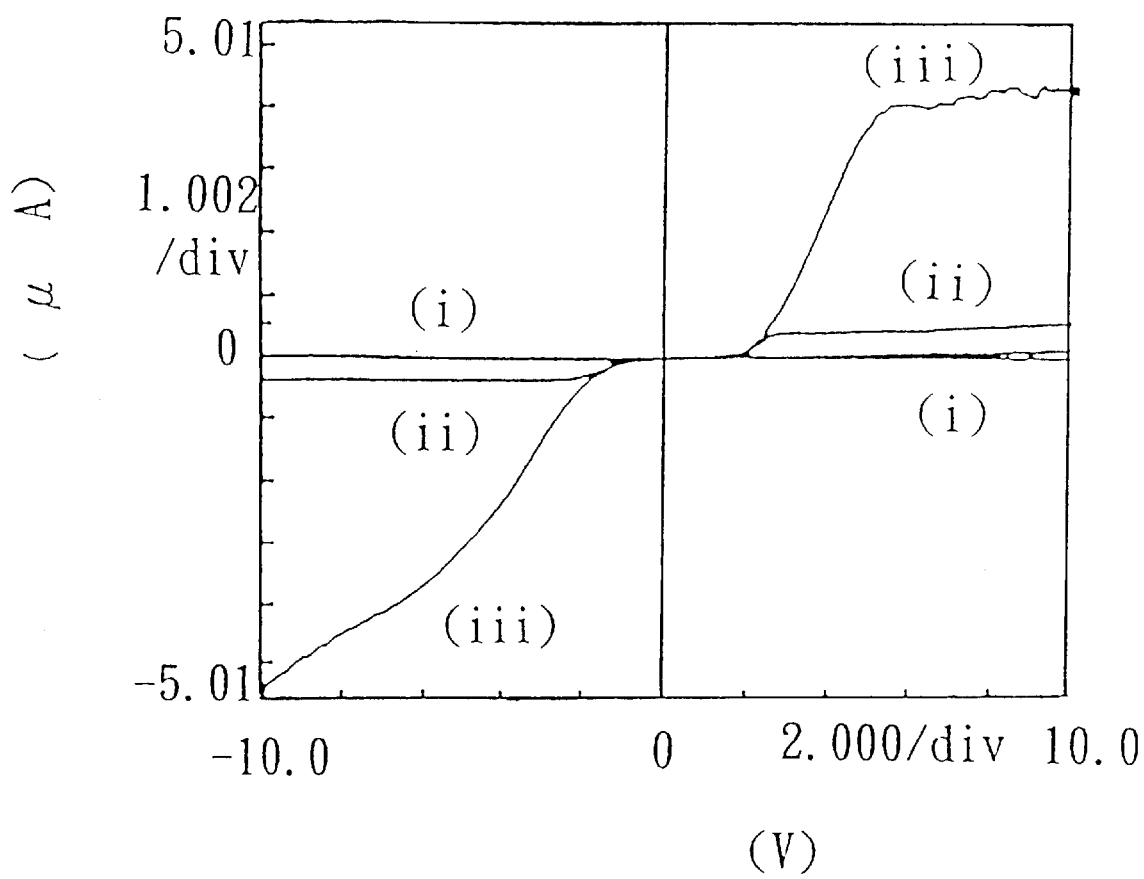

FIG. 6 shown the I-V characteristics of photocurrent of the porous silicon metal-semiconductor-metal planar photodetector after being processed by rapid thermal oxidation (RTO) for 90 sec at 850° C. (without being processed by rapid thermal annealing).

(i) I-V characteristics of dark current.

(ii) I-V characteristics of photocurrent under the illumination of 0.85 mW 675 nm laser diode.

(iii) I-V characteristics of photocurrent under the illumination of 24 mW/cm$^2$ tungsten lamp.

Figure 7:
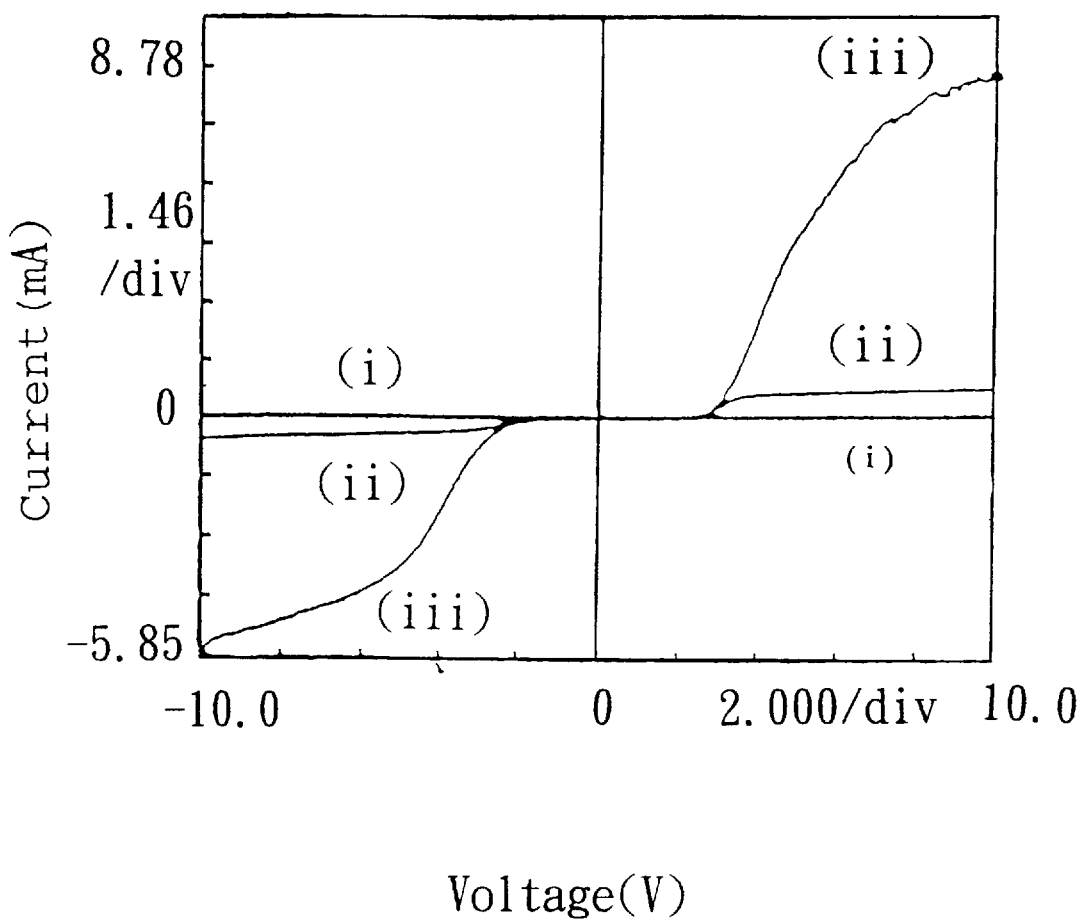

FIG. 7 shown the I-V characteristics of photocurrent of the porous silicon metal-semiconductor-metal planar photodetector after being processed by rapid thermal oxidation (RTO) at 850° C. for 90 sec, and then processed by rapid thermal oxidation (RTO) at 850° C. for 60 sec.

(i) I-V characteristics of dark current.

(ii) I-V characteristics of photocurrent under the illumination of 0.85 mW 675 nm laser diode.

(iii) I-V characteristics of photocurrent under the illumination of 24 mW/cm$^2$ tungsten lamp.

DESCRIPTION OF THE PREFERRED EMBODIMENTS

The goal of the present invention is to fabricate planar porous silicon metal-semiconductor-metal photodetector, and applies the method of rapid thermal oxidation (RTO) and rapid thermal annealing (RTA) to improve the photocurrent and photosensitivity of the porous silicon metal-semiconductor-metal photodetector, and also to improve the dark current of the present invention so that the application of planar metal-semiconductor-metal photodetector in optoelectronic integrated circuit is even more widespread.

The goal of the present invention is to fabricate the structure of planar porous silicon metal-semiconductor-metal photodetector. The structure of the present invention from top to bottom is: aluminum finger type electrode/porous silicon/silicon substrate/aluminum ohmic contact.

Said the method of fabricating porous silicon metal-semiconductor-metal planar photodetector of the present invention, which includes the following steps:

(1) Plate one layer of conducting material on the back side of the silicon substrate;

(2) Anneal the silicon substrate which is plated with conducting material on the back side in inert gas for some time;

(3) Apply one layer of anti-corrosion coating on the conducting material on the back side of the silicon substrate;

(4) Soak the silicon substrate into the aqueous solution of HF with appropriate concentration, apply proper amount of current, and etch the silicon surface for a proper duration to form porous silicon;

(5) Remove the anti-corrosion coating on the back side of the silicon substrate;

(6) Oxidize the porous silicon in rapid thermal oxidation furnace for a proper duration at a proper temperature to increase carrier lifetime, improve the photocurrent and photosensisitivity of the porous silicon photodetector;

(7) Put the porous silicon substrate into rapid thermal annealing furnace, do rapid thermal annealing for a proper duration at a proper temperature to remove the defect, so that very good photocurrent response and very low dark current of the porous silicon photodetector can be obtained;

(8) Plate finger type electrode on porous silicon to obtain high quality planar porous silicon metal-semiconductor-metal photodetector.

Said the method of fabricating porous silicon metal-semiconductor-metal planar photodetector in the present invention, wherein said the conducting material is aluminum, wherein said the anti-corrosion coating is black wax, wherein said the structure of the finger type electrode is as shown in FIG. 1, wherein said the condition to form porous silicon is: current density 20 mA/cm$^2$, HF concentration 5%, etching time 15 min, the temperature and duration of rapid thermal oxidation and rapid thermal annealing are in the range of 600° C.~950° C. and 15~180 sec.

The following is the technical details and the special feature of the present invention:

Said the process of fabricating porous silicon metal-semiconductor-metal photodetector in the present invention is: (1) Plate aluminum on the back surface of the silicon wafer after ultracleaning, anneal to form ohmic contact, then apply black wax for protection. (2) The condition to form porous silicon is: current density 20 mA/cm$^2$, HF concentration 5%, etching time 15 min and then remove the black wax. (3) Plate aluminum electrode on the front surface of silicon wafer, the structure is as shown in FIG. 1. (4) cut the sample into 5×5 cm$^2$ dies, then package with TO-5, then porous silicon metal-semiconductor-metal photodetector is formed.

According to the report of V. Petrova-Koch et al. in *Appl. Phys. Lett.*, Vol. 61, pp. 943 (1992), the surface of porous silicon is filled with imperfect native oxide and according to the report of J. Yan et al in *Appl. Phys. Lett.*, Vol. 64, pp. 1374 (1993), recombination centers will form on the unstable hydrogen-passivated surface to reduce the lifetime of carrier, increase the dark current, and then reduce the photocurrent and photosensitivity, make the porous silicon photodetector unstable. This can be improved by RTO (rapid thermal oxidation) which can replace the imperfect native oxide with stable oxide and remove the unstable hydrogen-passivated surface, i.e. remove the recombination center, increase the carrier lifetime, and reduce the dark current, thus improve the photocurrent and photosensitivity of the porous silicon photodetector. Additionally, a structure of non-stoichiometric silicon oxide will form on the porous silicon surface due to the rapid oxidation and will form tunneling centers, which will increase the dark current of the photodetector at the same time, this can be improved by RTA (rapid thermal annealing) to remove the structure of non-stoichiometric silicon oxide, and improve the dark current.

The condition to form porous silicon is: current density 20 mA/cm$^2$, HF concnentration 5%, etching time 15 min, and then processed by rapid thermal annealing at 850° C. for 60 sec. The structure of the porous silicon photodetector is shown in FIG. 1. FIG. 2 is the photocurrent response and the I-V characteristics of dark current. FIG. 2(a) is the I-V characteristics of dark current. At −10V the dark current is 38.2 $\mu$A, at +10V the dark current is 65.2 $\mu$A, FIG. 2(b) is the I-V characteristics of photocurrent under the illumination of 0.85 mW 675 nm laser diode. At −10V the photocurrent is 485 $\mu$A, at +10V the photocurrent is 365 $\mu$A, FIG. 2(c) is the I-V characteristics of photocurrent under the illumination of 24 mW/cm$^2$ tungsten lamp. At −10V the photocurrent is 3.81 mA, at +10V the photocurrent is 3.71 mA. The photocurrent will increase with voltage, and gradually reach saturation when the voltage is larger than 2V. The illustration in FIG. 2 is the detailed plot of dark current. From the figure, the fabrication process can actually make a planar porous silicon metal-semiconductor-metal photodetector.

The photocurrent with respect to the oxidation time of rapid thermal oxidation (RTO) of porous silicon metal-semiconductor-metal planar photodetector is shown in FIG. 3. FIG. 3 (i) is the variation of photocurrent with respect to the oxidation time of rapid thermal oxidation (RTO) under the illumination of 24 mW tungsten lamp at −10V FIG. 3 (ii) is the variation of photocurrent with respect to the oxidation time of rapid thermal oxidation (RTO) under the illumination of 0.85 mW 675 nm laser diode at −10V. The photocurrent will increase with the oxidation time of RTO when the oxidation time is less than 150 sec. The maximum photocurrent is 15.9 mA in FIG. 3 (i), 1.83 mA in FIG. 3 (ii). From the figure, the RTO process can actually improve the photocurrent of the photodetector. For the case of 120 sec, the photosensitivity under the illumination of 0.85 mW 675 nm laser diode is 2.15 A/W after conversion. The corresponding quantum efficiency is 400%, this comes from the avalanche effect inside the porous silicon, and the latter is generated by the voltage drop in porous silicon which is intrinsic and as narrow as silicon wire. When the oxidation time is lager than 150 sec, the thickness of oxidation layer is so thick that the series resistance is too large, so the photocurrent will decrease with the RTO time.

Dark current is a very important characteristics of photodetector. FIG. 4 is the I-V characteristics of dark current after being processed by rapid thermal oxidation (RTO) at 850° C. for 90 sec (without being processed by rapid thermal annealing) of the planar porous silicon metal-semiconductor-metal photodetector. At −10V the dark current is 18.4 $\mu$A, the corresponding photocurrent is shown in FIG. 6, the photocurrent is 0.4 mA at −10V under the illumination of laser diode. At +10V the photocurrent is 0.5 mA as shown in FIG. 6 (ii). Under the illumination of 24 mW/cm$^2$ tungsten lamp, at −10V the photocurrent is 5.61 mA, at +10V the photocurrent is 4.31 mA as shown in FIG. 6 (iii). FIG. 5 is the I-V characteristics of dark current of the porous silicon metal-semiconductor-metal planar photodetector after being processed by rapid thermal oxidation (RTO) at 850° C. for 90 sec, and then processed by rapid thermal oxidation (RTO) at 850° C. for 60 sec. At −10V the dark current is decreased to 1.8 $\mu$A, the corresponding photocurrent is shown in FIG. 7, the photocurrent is 0.58 mA at −10V under the illumination of laser diode. At +10V the photocurrent is 0.73 mA as shown in FIG. 7 (ii). Under the illumination of 24 mW/cm$^2$ tungsten lamp, at −10V the photocurrent is 5.98 mA, at +10V the photocurrent is 8.52 mA as shown in FIG. 7 (iii). From the figure, RTO and RTA can actually improve the characteristics of the planar porous silicon metal-semiconductor-metal photodetector.

The planar porous silicon metal-semiconductor-metal planar photodetector fabricated by the present invention has 400% high gain. The photosensitivity of the present invention is much more improved than the other photodetector. The characteristics of the present invention is much improved, no matter in that of photocurrent or photosensitivity.

What is claimed is:

1. A method of fabricating a planar porous silicon metal-semiconductor-metal photodetector, said method comprising the following steps:
    (a) plating one layer of conducting material on a back side of a silicon substrate;
    (b) annealing the silicon substrate which is plated with conducting material on the back side in inert gas for some time;
    (c) applying one layer of anti-corrosion coating on the conducting material on the back side of the silicon substrate;
    (d) soaking the silicon substrate into an aqueous solution of HF with appropriate concentration, applying a proper amount of current, and etching the silicon surface for a proper duration to form porous silicon;
    (e) removing the anti-corrosion coating on the back side of the silicon substrate;
    (f) oxidizing the porous silicon in rapid thermal oxidation furnace for 15 to 180 seconds at 600 to 950° C. to increase carrier lifetime and improve the photocurrent and photosensitivity of the porous silicon photodetector;
    (g) placing the porous silicon substrate into a rapid thermal annealing furnace, conducting rapid thermal annealing for 15 to 180 seconds at 600 to 950° C. to remove defects, so that very good photocurrent response and very low dark current of the porous silicon photodetector can be obtained; and
    (h) plating finger type electrodes on the porous silicon to obtain a high quality planar porous silicon metal-semiconductor-metal photodetector.

2. The method as in claim 1, wherein said conducting material is aluminum.

3. The method as in claim 1, wherein said anti-corrosion coating is black wax.

4. The method as in claim 1, wherein the condition to form porous silicon is: current density-20 A/cm$^2$, HF concentration 5%, etching time 15 min.

* * * * *